(12) United States Patent
Malkin et al.

(10) Patent No.: US 9,705,430 B2
(45) Date of Patent: Jul. 11, 2017

(54) METHOD OF FORMING A DISC SPRING-BASED ENERGY HARVESTING DEVICE

(71) Applicant: The Boeing Company, Chicago, IL (US)

(72) Inventors: Matthew C. Malkin, Seattle, WA (US); Gerardo Pena, Seattle, WA (US)

(73) Assignee: THE BOEING COMPANY, Chicago, IL (US)

( * ) Notice: Subject to any disclaimer, the term of this patent is extended or adjusted under 35 U.S.C. 154(b) by 958 days.

(21) Appl. No.: 13/827,235

(22) Filed: Mar. 14, 2013

(65) Prior Publication Data

US 2013/0207521 A1 Aug. 15, 2013

Related U.S. Application Data

(60) Division of application No. 12/792,151, filed on Jun. 2, 2010, now Pat. No. 8,415,860, which is a (Continued)

(51) Int. Cl.
*H02N 2/00* (2006.01)
*H01L 41/053* (2006.01)
(Continued)

(52) U.S. Cl.
CPC ............. *H02N 2/22* (2013.01); *H01L 41/053* (2013.01); *H01L 41/0536* (2013.01);
(Continued)

(58) Field of Classification Search
CPC .......... H02N 2/021; H02N 2/186; H02N 2/22; H01L 41/053; H01L 41/0536; H01L 41/25; Y10T 29/42
See application file for complete search history.

(56) References Cited

U.S. PATENT DOCUMENTS

| 3,320,580 A | 5/1967 | Sykes |
| 3,360,664 A | 12/1967 | Straube |

(Continued)

FOREIGN PATENT DOCUMENTS

| JP | 2006056501 A | * 3/2006 |
| WO | WO 02/086981 | 10/2002 |

OTHER PUBLICATIONS

Mockensturm, Eric M. et al. "Active Structures Using Buckling Beam Actuators", 44th AIAA/ASME/ASCE/AHS Structures, Structural Dynamics, and Materials Conference; Apr. 7-10, 2003, Norfolk, Virginia, pp. 1-6.
(Continued)

*Primary Examiner* — A. Dexter Tugbang
(74) *Attorney, Agent, or Firm* — Patterson + Sheridan, LLP

(57) ABSTRACT

A method of forming an energy harvesting device comprises supporting an outer peripheral edge of a disc spring using a support element that allows oscillations of the disc spring. A first preload force is applied to the disc spring and directed along its axial center. During application of the first preload force, a piezoelectric material is fixedly secured with a surface of the disc spring. A second preload force is applied to the disc spring to thereby provide a predetermined reduction of a stiffness of the disc spring. The reduction of the stiffness corresponds to an increased sensitivity to low-frequency components of vibrational energy received by the energy harvesting device.

14 Claims, 6 Drawing Sheets

Related U.S. Application Data continuation-in-part of application No. 11/672,695, filed on Feb. 8, 2007, now abandoned.

(51) Int. Cl.
  *H02N 2/02* (2006.01)
  *H02N 2/18* (2006.01)
  *H01L 41/25* (2013.01)

(52) U.S. Cl.
  CPC ............ *H01L 41/25* (2013.01); *H02N 2/021* (2013.01); *H02N 2/186* (2013.01); *Y10T 29/42* (2015.01)

(56) References Cited

U.S. PATENT DOCUMENTS

| | | | |
|---|---|---|---|
| 3,857,049 A | 12/1974 | Zoltan | |
| 4,234,859 A * | 11/1980 | Ikushima | ............... Y10T 29/42 |
| | | | 29/25.35 |
| 4,383,195 A | 5/1983 | Kolm et al. | |
| 4,530,138 A * | 7/1985 | Ritter | .................. H01L 41/0536 |
| | | | 156/285 |
| 4,969,726 A | 11/1990 | Koning | |
| 5,053,671 A | 10/1991 | Kobayashi et al. | |
| 5,118,981 A | 6/1992 | Kobayashi et al. | |
| 5,323,083 A | 6/1994 | Smythe et al. | |
| 5,390,155 A | 2/1995 | Lea | |
| 5,394,375 A | 2/1995 | Iwashita | |
| 5,394,379 A | 2/1995 | Weichart et al. | |
| 6,664,712 B2 * | 12/2003 | Rayner | .................. H01L 41/25 |
| | | | 310/323.02 |
| 6,798,122 B1 | 9/2004 | Howarth et al. | |
| 7,446,459 B2 | 11/2008 | Xu et al. | |
| 2002/0074901 A1 * | 6/2002 | Johansson | ............. H02N 2/021 |
| | | | 310/328 |
| 2002/0109433 A1 | 8/2002 | Rayner et al. | |
| 2005/0134149 A1 | 6/2005 | Deng et al. | |
| 2006/0175937 A1 | 8/2006 | Clingman et al. | |

OTHER PUBLICATIONS

Nguyen, Quoc V. et al. "Improvement of actuation displacement of LIPCA implementing bifurcation phenomena", Smart Structures and Materials 2006; Active Materials: Behavior and Mechanics, edited by William D. Armstrong, Proc. of SPIE, vol. 6170, 6170IL (2006), pp. 6170IL-1-61701L8.

Lesieutre, George A. et al. "Can a Coupling Coefficient of a Piezoelectric Device Be Higher Than Those of Its Active Material?" Reprinted from Journal of Intelligent Material Systems and Structures, vol. 8, Oct. 1997, pp. 859-867.

Qiu, Jin et al. "A Centrally-Clamped Parallel-Beam Bistable MEMS Mechanism", 0-7803-5998-4/01@2001 IEEE, pp. 353-356.

Qiu, Jin et al. "A Curved-Beam Bistable Mechanism", Journal of Microelectromechanical Systems, vol. 13, No. 2, Apr. 2004, pp. 137-146.

Jung, Ibong et al. "Design and fabrication of piezoceramic bimorph vibration sensors", Sensors and actuators. A Physical, vol. 69, No. 3, 1988, pp. 259-266.

Post-Buckled Precompressed (PBP) Actuators: Enhancing VTOL Autonomous High Speed MAVs by Ron Barrett; 46th AIAA/ASME/ASCE/AHS/ASC Structures, Structural Dynamics & Materials Conference Apr. 18-21, 2005, Austin, Texas.

* cited by examiner

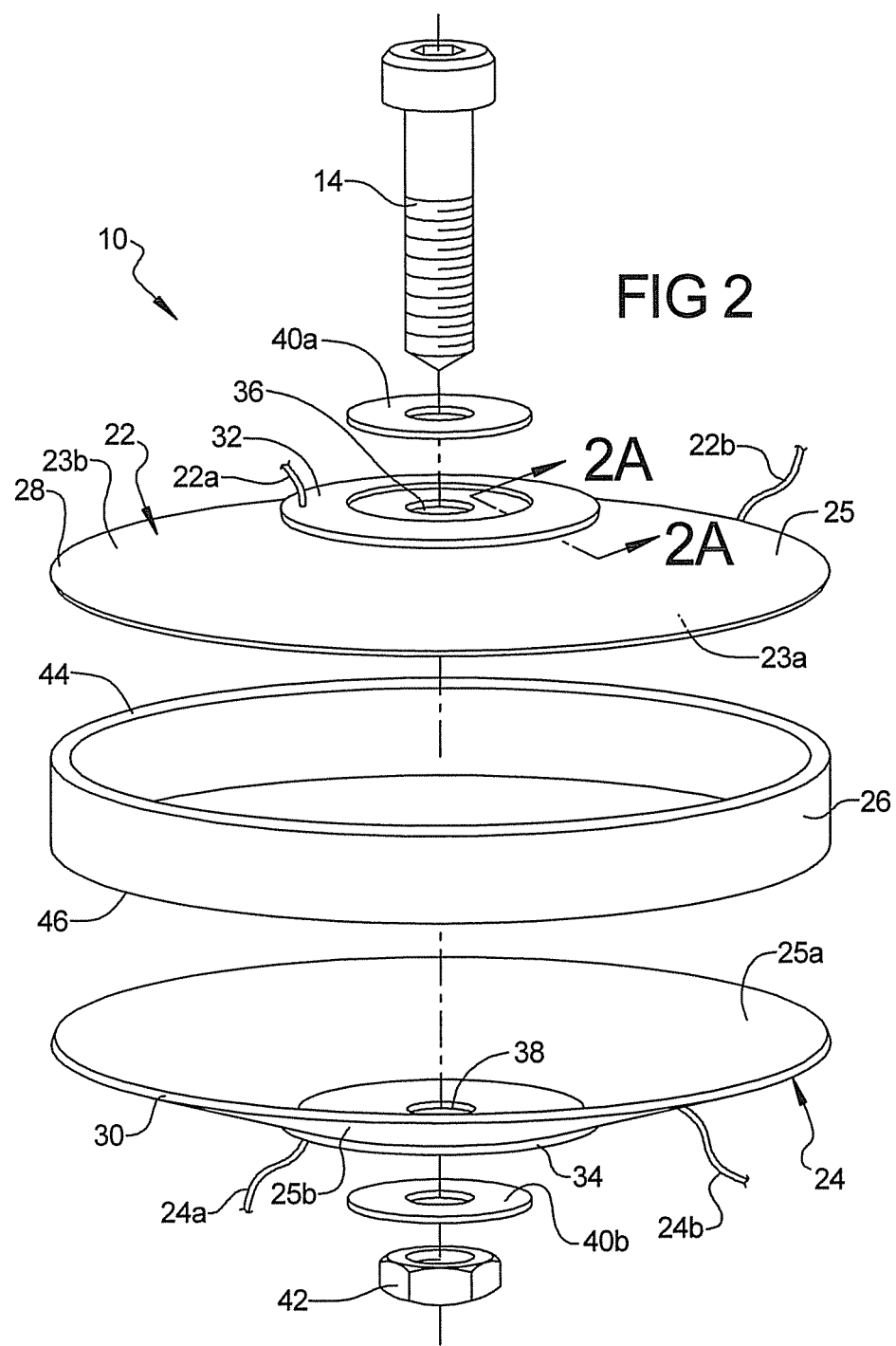

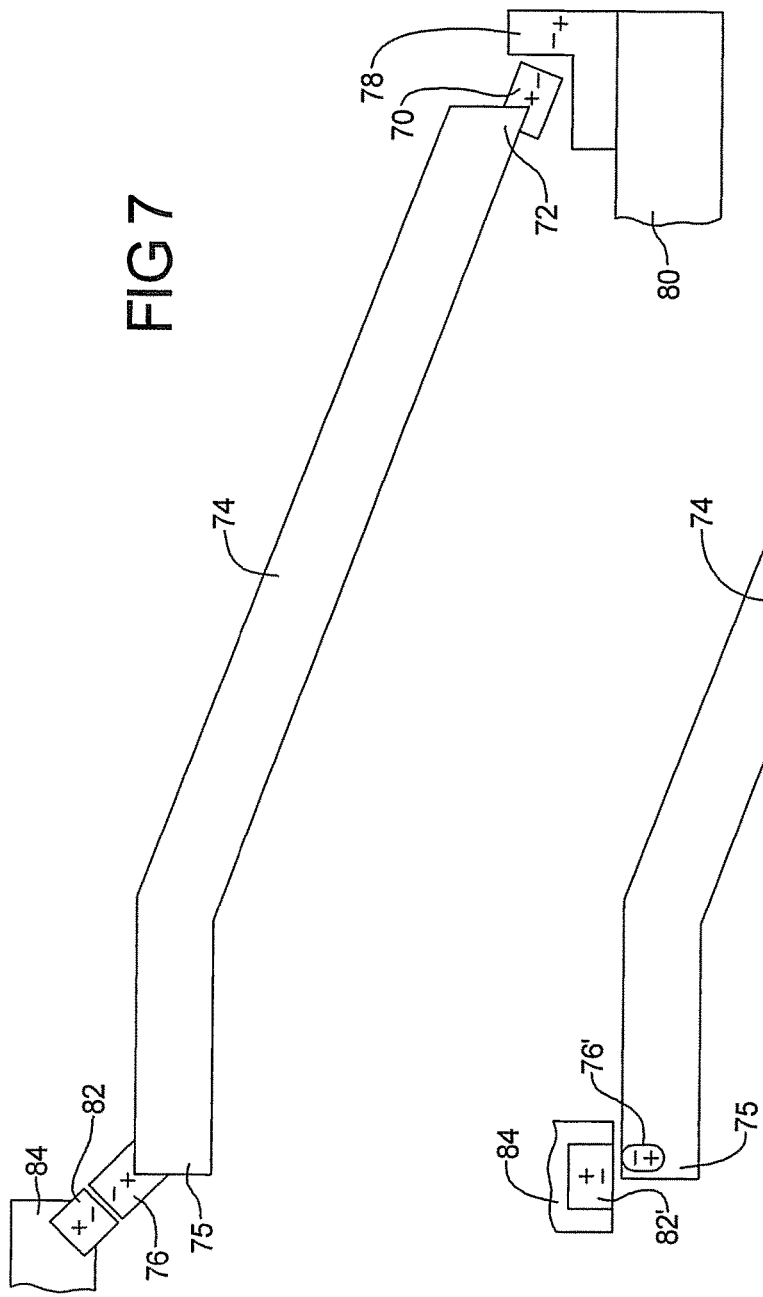
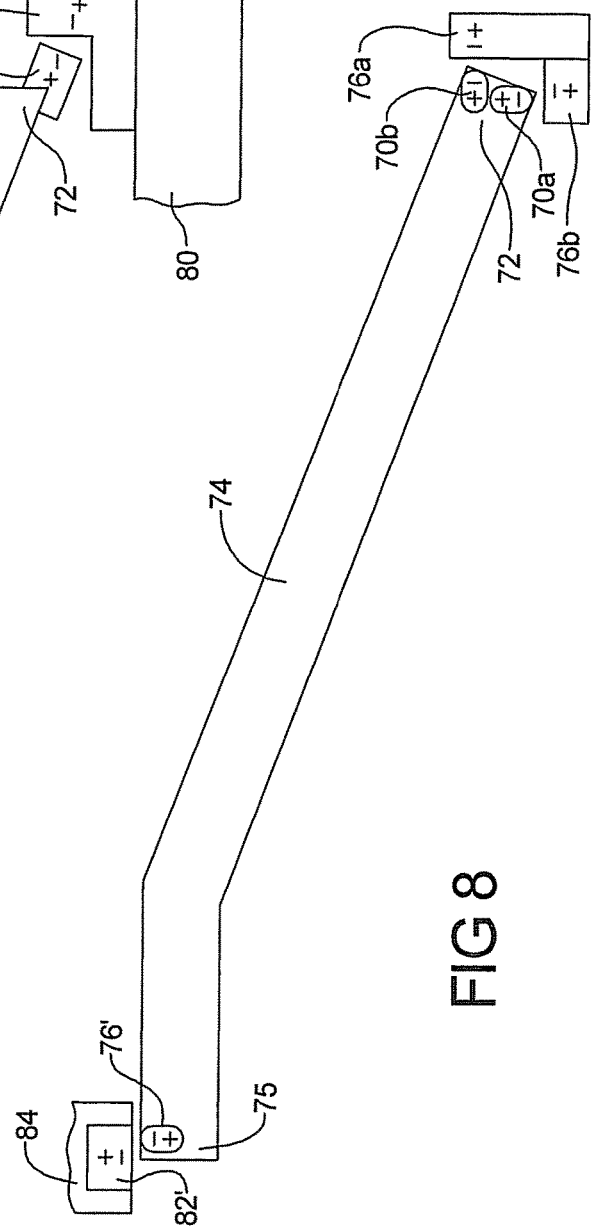

METHOD OF FORMING A DISC SPRING-BASED ENERGY HARVESTING DEVICE

CROSS-REFERENCE TO RELATED APPLICATIONS

This application is a divisional of U.S. patent application Ser. No. 12/792,151, filed on Jun. 2, 2010, which is a continuation-in-part of U.S. patent application Ser. No. 11/672,695 filed on Feb. 8, 2007. The entire disclosures of each of the above applications are incorporated herein by reference.

FIELD

The present disclosure relates to energy harvesting apparatus and methods and, more particularly, to an energy harvesting apparatus and method that makes use of a spring disc, commonly known as a "Belleville" spring, to harvest vibration energy from a vibrating structure.

BACKGROUND

The statements in this section merely provide background information related to the present disclosure and may not constitute prior art.

Electrically-powered devices require a power source. Electrical power can be supplied in a variety of ways, including through wiring from a centralized source or from a battery. Many electrical devices are used on mobile platforms, such as aircraft, aerospace vehicles, rotorcraft, etc. The wiring typically used in these applications is heavy and costly. The use of batteries requires periodic replacement and/or recharging. In addition, a battery contains corrosive materials, and this can be a factor in limiting the use of a battery in some applications. Furthermore, in some aerospace and aircraft applications such as flight testing, various forms of sensors are located in areas where it would be costly to route power wiring.

Various attempts have been made to use piezoelectric material as a component of an energy harvesting device. When piezoelectric material is strained, an electrical charge is generated through the coupling of the mechanical and electrical states of the material. The charge generated can be useful electrical energy. The development of areas and methods of harnessing this electrical energy is finding considerable interest at the present time for their potential to power various forms of sensors and electrical components, and especially in applications where it is impractical or difficult to make use of a battery and/or wiring leading to the sensor or device.

Various forms of piezoelectric devices have attempted to convert vibrating energy from a structure into useful electrical energy. However, many piezoelectric energy harvesting devices have difficulty harvesting vibration energy at low frequencies (i.e., frequencies typically less than 100 Hz). The problem with such piezoelectric devices is their lack of sensitivity to low frequency vibration energy. A device able to convert low frequency vibration energy into useful electrical energy would thus prove highly useful in a wide variety of applications where the need exists to power a remotely located sensor or other form of electronic device.

SUMMARY

In one aspect the present disclosure relates to a method for forming an energy harvesting device. The method may comprise providing a disc spring and supporting an outer peripheral edge of the disc spring. The method may further comprise applying a pre-load force to an inner peripheral edge of the disc spring directed along an axial center of the disc spring, and while the pre-load force is being applied, using an adhesive compound to adhere a piezoelectric material to a surface of the disc spring. The method may further comprise waiting a predetermined time until the adhesive compound has cured. The disc spring may be secured to a support element using a fastening assembly, and the fastening assembly and the support element used to apply a predetermined preload force to said disc spring. The pre-load force may cause a degree of deflection of the disc spring, with the deflection being sufficient to place the disc spring in a condition of reduced stiffness.

In another aspect the present disclosure relates to a method for harvesting vibration energy from a vibrating source. The method may involve securing a pair of disc springs to the vibrating source. The disc springs may be held in opposing relationship and pre-loaded with a force sufficient to substantially soften the disc springs and to make the disc springs sensitive to low frequency, low amplitude vibration energy. A material may be secured to a first one of the disc springs. The material may generate an electrical output signal in response to changes in strain that is experienced as the first disc spring flexes in response to vibration transmitted from said vibrating structure. Electrical output signals may be received from the material as the one disc spring flexes during vibration of the structure.

In still another aspect the present disclosure relates to a method for forming an energy harvesting device. The method may involve providing a disc spring and supporting an outer peripheral edge of the disc spring. A pre-load force may be applied to the disc spring which is directed along an axial center of the disc spring. While the pre-load force is being applied, a piezoelectric material may be fixedly secured to a surface of the disc spring. The disc spring may be supported from a peripheral edge thereof to allow oscillating motion of the disc spring. The support element may be used to apply a predetermined preload force to the disc spring that reduces a stiffness of the disc spring.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

FIG. 2 is an exploded perspective view of the apparatus of FIG. 1;

FIG. 7 is a simplified side view of an arrangement for supporting one of the disc springs by use of a magnetic bearing; and FIG. 8 is a simplified side view of an alternative magnetic bearing arrangement for supporting one of the disc springs.

DETAILED DESCRIPTION

The following description is merely exemplary in nature and is not intended to limit the present disclosure, application, or uses.

Figure 1:
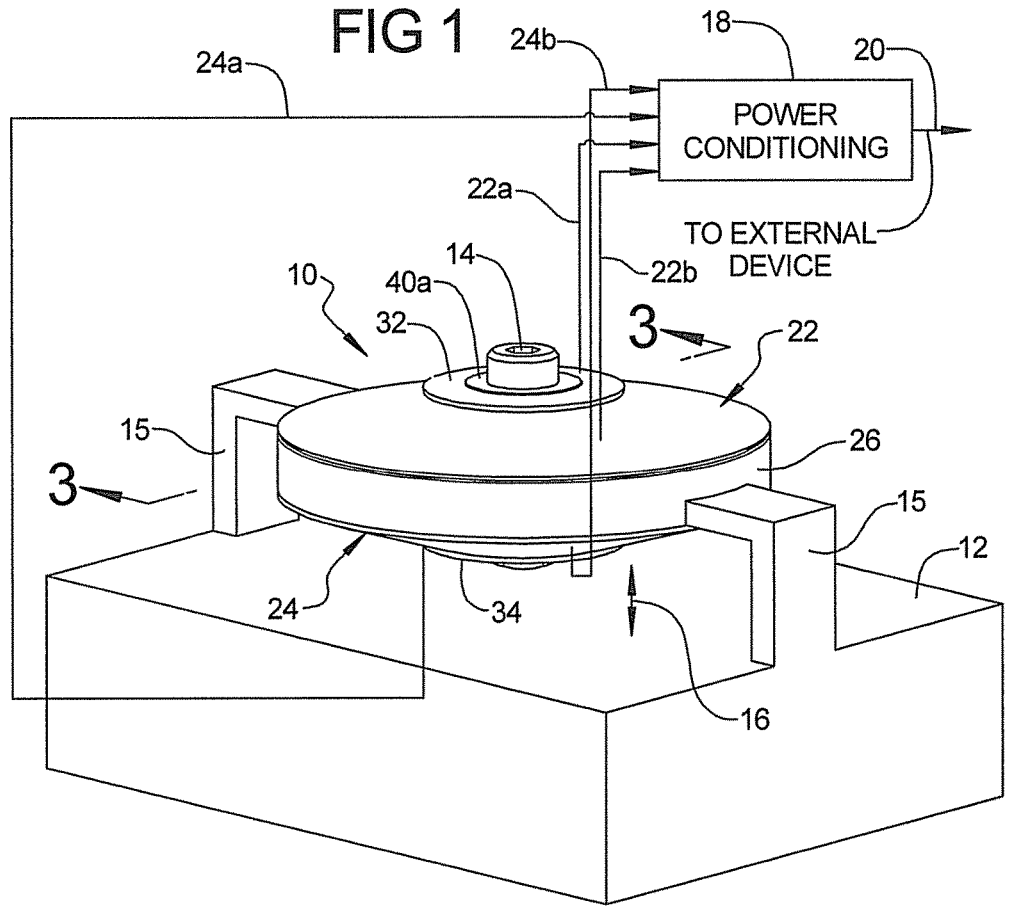
FIG. 1 is a perspective view an energy harvesting apparatus in accordance with one embodiment of the present disclosure.

Referring to FIG. 1, there is shown an exemplary energy harvesting apparatus in accordance with an embodiment of the present disclosure. The energy harvesting apparatus 10 may be mounted to a vibrating structure 12 that vibrates at a frequency over a relatively wide frequency range (e.g., between about 10 Hz-1 KHz). The apparatus 10 is supported from the vibrating structure 12 in this example by mounting arms 15 that are secured in any suitable manner to the vibrating structure 12. Thus, the apparatus 10 receives the vibration energy from the structure 12 and vibrates in accordance with the structure. Preferably, the apparatus 10 is mounted relative to the structure 12 such that the axis of motion of the apparatus 10 is parallel to the axis of vibration being experienced by the structure 12, in this example along the axis defined by arrow 16.

The apparatus 10 generates electrical power in response to the vibration energy from the vibrating structure 12 and transmits the electrical power to a suitable power conditioning system 18, which then supplies an electrical power output 20 to an electronic or electromechanical device requiring electrical power. While the apparatus 10 is especially well suited for providing electrical power to power other electrical, electronic or electromechanical devices, it will be appreciated that the electrical output signals generated by the apparatus 10 could just as readily be used to turn on and off a sensor or other electrical, electronic or electromechanical component or be conditioned and stored in a circuit for later use.

Figure 2A:
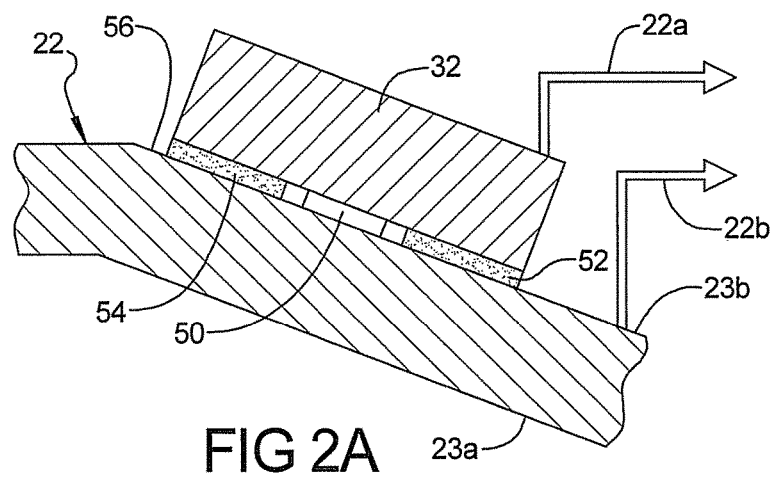
FIG. 2A is an enlarged cross sectional view showing the attachment of one of the piezoelectric material rings to its associated spring disc, as taken in accordance with section line 2A-2A in FIG. 2.
Figure 3:
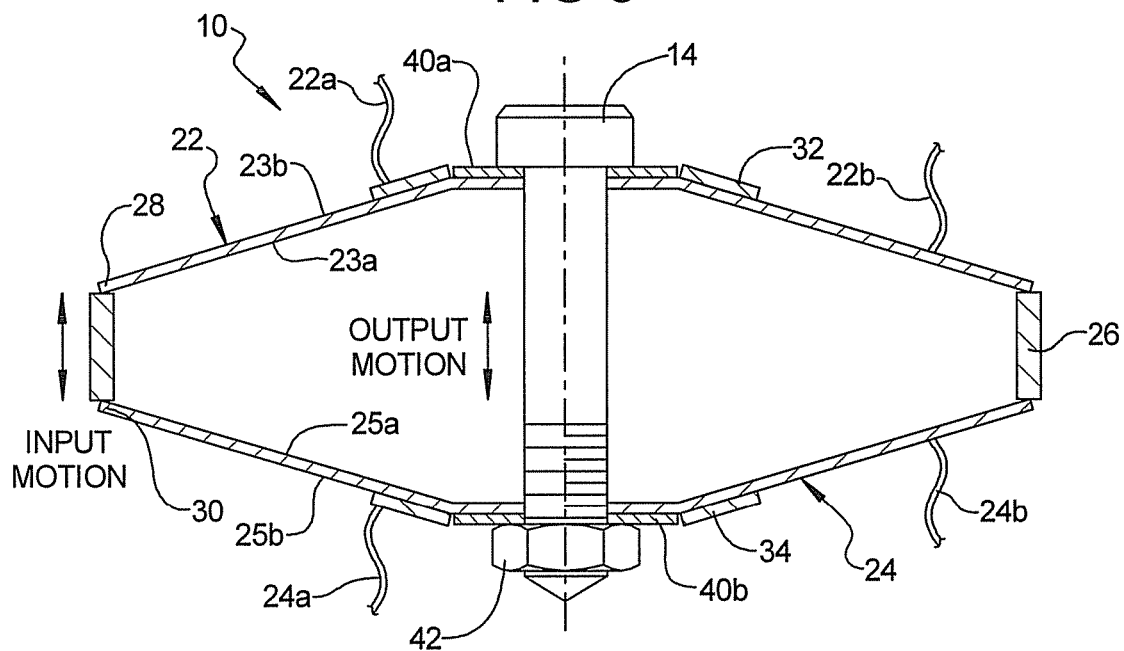
FIG. 3 is a cross-section of the assembled apparatus in accordance with section 3-3 in FIG. 1.

Referring to FIGS. 2 and 3, the construction of the apparatus 10 is shown in greater detail. The apparatus 10 generally includes a first disc spring 22, a second disc spring 24 and a support ring 26 for supporting peripheral edge portions 28 and 30 of the first and second disc springs 22 and 24, respectively. The disc springs 22 and 24 may comprise well known "Belleville" springs. Alternatively, any resilient, frustoconical shaped disc is potentially useable. A power conditioning subsystem 18, as will be further described in the following paragraphs, processes the electrical signals obtained from the apparatus.

The first disc spring 22 further includes a ring of electrically responsive material 32, which in one preferred form may comprise a piezoelectric material ring. Similarly, the second disc spring 24 includes an electrically responsive material ring 34 secured thereto, which also may comprise a piezoelectric material ring. For convenience, material rings 32 and 34 will be referred to as "piezoelectric" material rings throughout the following discussion. It will be appreciated, however, that any material that is able to generate electrical signals in response to changes in strain may be used in place of a piezoelectric material. Such other materials might include polyvinylidine fluoride (PVDF) film. Each piezoelectric material ring 32,34 is further arranged coaxially with the axial center of its associated disc spring 22 or 24.

Electrical conductor 22a is electrically coupled to the piezoelectric material ring 32 by any suitable conductive adhesive or mechanical connection, while electrical conductor 22b may be similarly coupled to the first disc spring 22. Conductors 22a and 22b feed the potential difference signal generated across the piezoelectric material ring 32 to a first input channel of the power conditioning system 18. Conductor 24a is electrically coupled to the second piezoelectric material ring 34 by any suitable conductive adhesive or mechanical connection, and conductor 24b may be similarly conductively coupled to the second disc spring 24. Conductors 24a and 24b feed the potential difference signal generated across the second piezoelectric material ring 34 into a second input second channel of the power conditioning circuit 18. The power output 20 of the power conditioning system 18 represents an electrical signal that may be related to the vibration energy harvested by the apparatus 10.

Referring further to FIGS. 2 and 3, the first disc spring 22 includes an aperture 36 at its axial center, while the second disc spring 24 similarly includes an aperture 38 at its axial center. The fastening member 14 is inserted through a washer 40a, which may be optional, through the apertures 36 and 38, through an optional washer 40b, and is engaged with a nut 42 to hold the disc springs 22 and 24 clamped against oppositely facing edge portions 44 and 46 of the support ring 26, and in an opposing but axially aligned relationship. In this regard, it should be appreciated that edge portions 44 and 46 may include a notch or shoulder formed therein to help maintain the disc springs 22 and 24 axially aligned during an assembly procedure. The fastening member 14 also may have a length that is sufficiently long to enable it to be used to secure the apparatus 10 to the vibrating structure 12, in place of the arms 15 shown in FIG. 1. The fastening member 14 and the threaded nut 42 allow an adjustable degree of preload force to be applied to the disc springs 22 and 24 during assembly. This is advantageous, as will be explained in the following paragraphs. Depending on the thread count of the fastening member 14, and analytical or computational modelling or empirical testing, it is possible to determine that a specified number of turns of the fastening member 14 will apply a known preload force to the disc springs 22,24. The mass of the fastening member 14 and nut 42 may increase the amplitude of the motion of the apparatus 10, further increasing the sensitivity of the system to low frequency vibration energy.

Figure 5:
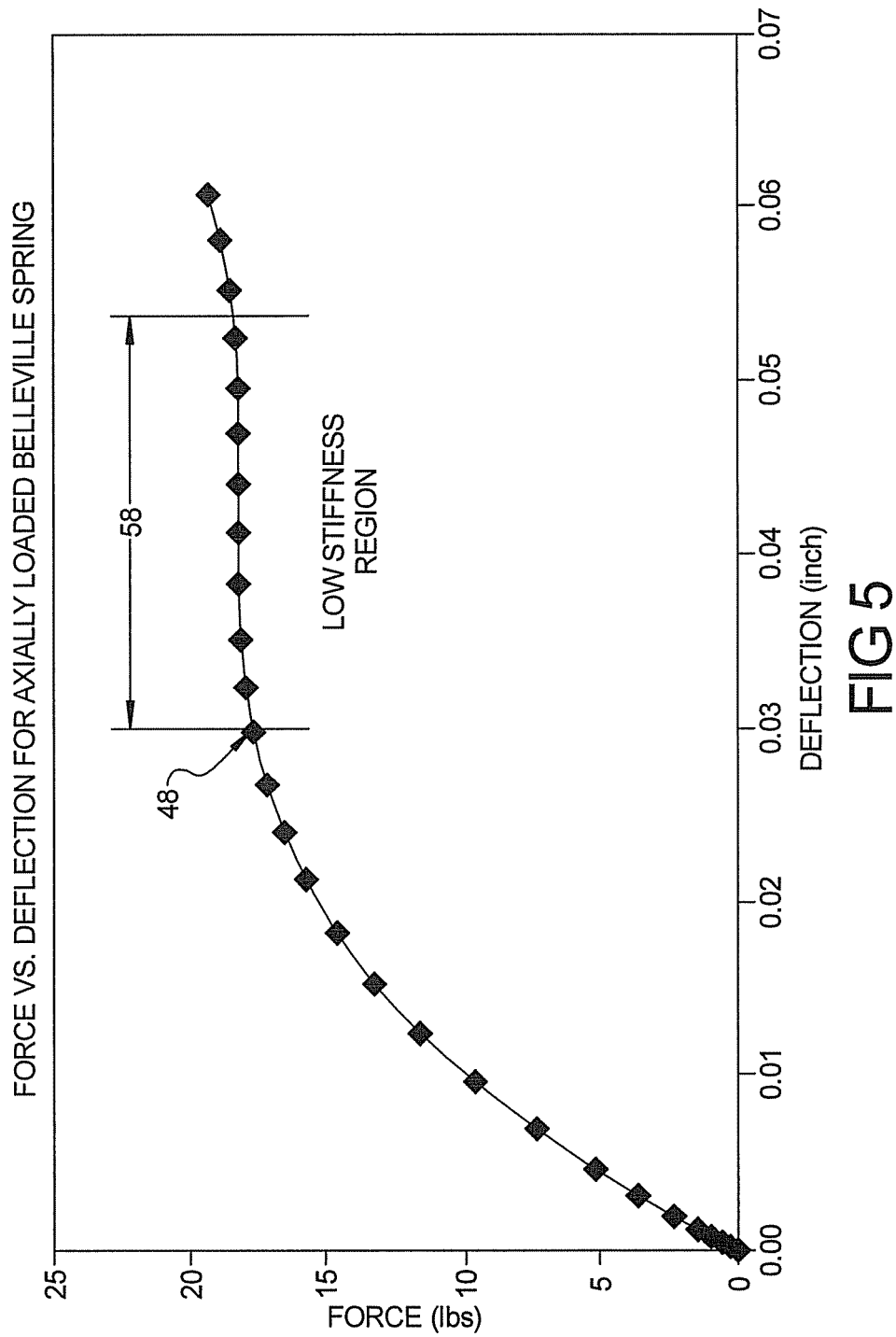
FIG. 5 is a force versus deflection curve for the spring disc of FIG. 4 illustrating the region of low stiffness which the spring disc of FIG. 4 is pre-loaded to once fully assembled.

With further reference to FIGS. 2 and 3, the assembly of disc spring 22 and the piezoelectric material ring 32 will be described in greater detail. Disc springs 22 and 24 may be made from spring steel or any other material having suitable resilient properties, such as carbon fiber reinforced plastic. The disc springs 22 and 24 are held by a suitable tool (not shown) in axial alignment with one another, with their outer peripheral edges 28 and 30 against the support ring 26. Using fastening member 14, a predetermined preload force is applied to the disc spring. This causes the disc springs 22 and 24 to flex (i.e., deflect) slightly. The precise preload may vary depending upon the geometry of the cross section of the disc springs 22,24. Preferably, the amount of preloading is sufficient to place the disc springs 22, 24 at the middle of a range of low stiffness. For a single disc spring 22 or 24, this range is illustrated in FIG. 5. In this example, the preloading force would be sufficient to cause a deflection of one of the disc springs 22 or 24 by at least about 0.03 inch (0.762 mm), which puts it at approximately the beginning point of the "reduced stiffness" range (i.e., point 48) on the graph of FIG. 5, and more preferably by about 0.042 inch (1.0668 mm) to place it at the midpoint of the reduced stiffness range.

With further reference to FIGS. 2 and 2A, while the disc spring 22 is held with the above-described degree of preloading force, the piezoelectric material ring 32 is adhered thereto. In one specific form of assembly, a plurality of spaced apart drops of conductive adhesive 50 are placed along the undersurface 52 of the piezoelectric material ring 32, and separated by a layer or nonconductive adhesive 54. The conductive adhesive drops 50 provide electrical conductivity between the piezoelectric material ring 32 and the disc spring 22, which allows the disc spring to conveniently act as an electrical connection to the electrode on the piezoelectric material ring 32 that is in contact with the disc spring 22. Conductors 22a and 22b electrically coupled to the disc springs 22, 24 allow the electrical current generated by the piezoelectric material layers 32, 34 to be transmitted to the power conditioning subsystem 18 (FIG. 1).

Nonconductive adhesive 54 is used to provide a strong bond between the piezoelectric material layer 32 and the outer surface 56 of the disc spring 22. Prior to adhering the piezoelectric material layer 32, it is also preferred to thoroughly clean the outer surface 56 of the disc spring 22, and possibly also to sand the surface 56 so that a surface is presented that will enable a strong bond to be achieved. For the conductive adhesive 50, various forms of adhesive may be used, but one suitable adhesive is CHO-BOND®, a two-part conductive epoxy commercially available from Chomerics, a company of the Parker Hannifin Corporation. The non-conductive adhesive 54 may also take a plurality of forms, but one suitable adhesive is commercially available LOCTITE-HYSOL® 9330 two-part epoxy.

Once the adhesives 50 and 54 have cured, any tooling being used to hold the disc springs 22,24 in place during the curing process may be removed. Once this manufacturing operation has been completed for both of the disc springs 22 and 24, the apparatus 10 may be assembled and the nut 42 adjustably tightened on the fastening member 14. The nut 42 is tightened sufficiently to provide a preload force that deflects each of the disc springs 22 and 24 to approximately a midpoint of its low stiffness region. The low stiffness region for one of the disc springs 22 or 24 is defined by arrow 58 in FIG. 5.

Figure 4:
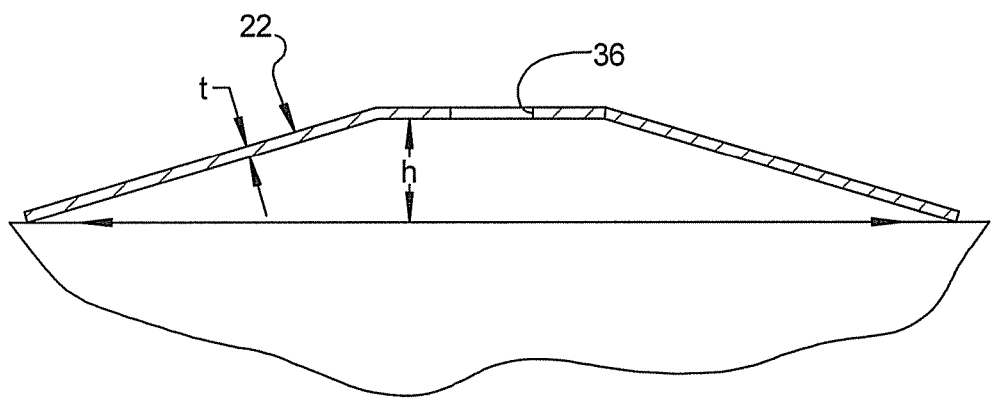
FIG. 4 is a simplified side view of one of the spring discs illustrating the geometry of the spring disc.

With further reference to FIGS. 4 and 5, it will be appreciated that, when loaded, the disc springs 22 and 24 of apparatus 10 will typically exhibit non-linear stiffness. The extent of this non-linear stiffness is governed primarily by the height-to-thickness ratio (h/t) of the disc spring 22 or 24. The thickness is denoted by "t" in FIG. 4, while the height is denoted by "h" in FIG. 4. It will also be appreciated that attaching the piezoelectric material ring 32 to the disc spring 22 essentially increases the effective thickness of the disc spring 22,24 and thus decreases its height-to-thickness ratio (h/t), which in turn alters the non-linearity of the force-deflection curve shown in FIG. 5. Thus, the dimensions of the piezoelectric material rings 32 and 34 will also need to be considered when tailoring the response of the disc springs 22 and 24, respectively, to place them each in their low stiffness operating region.

Still another factor that must be taken into account is the added stiffness of the piezoelectric material rings 32 and 34. Preferably, the added stiffness provided by the piezoelectric material rings 32 and 34 is accounted for by selecting disc springs 22 and 24 that have suitably high height-to-thickness ratios. Generally, the higher the height-to-thickness ratio for the disc spring, the more piezoelectric material that can be attached (i.e., the greater the thickness of the piezoelectric material layer 34 that can be used). It is also possible to use disc springs having tapering wall thicknesses. It will also be appreciated that the threaded fastener 14, the nut 42 and the washer 40 may also impact tuning of the disc springs 22 and 24, and therefore will likely need to be accounted for when setting the preload force for the disc springs 22,24.

Figure 6:
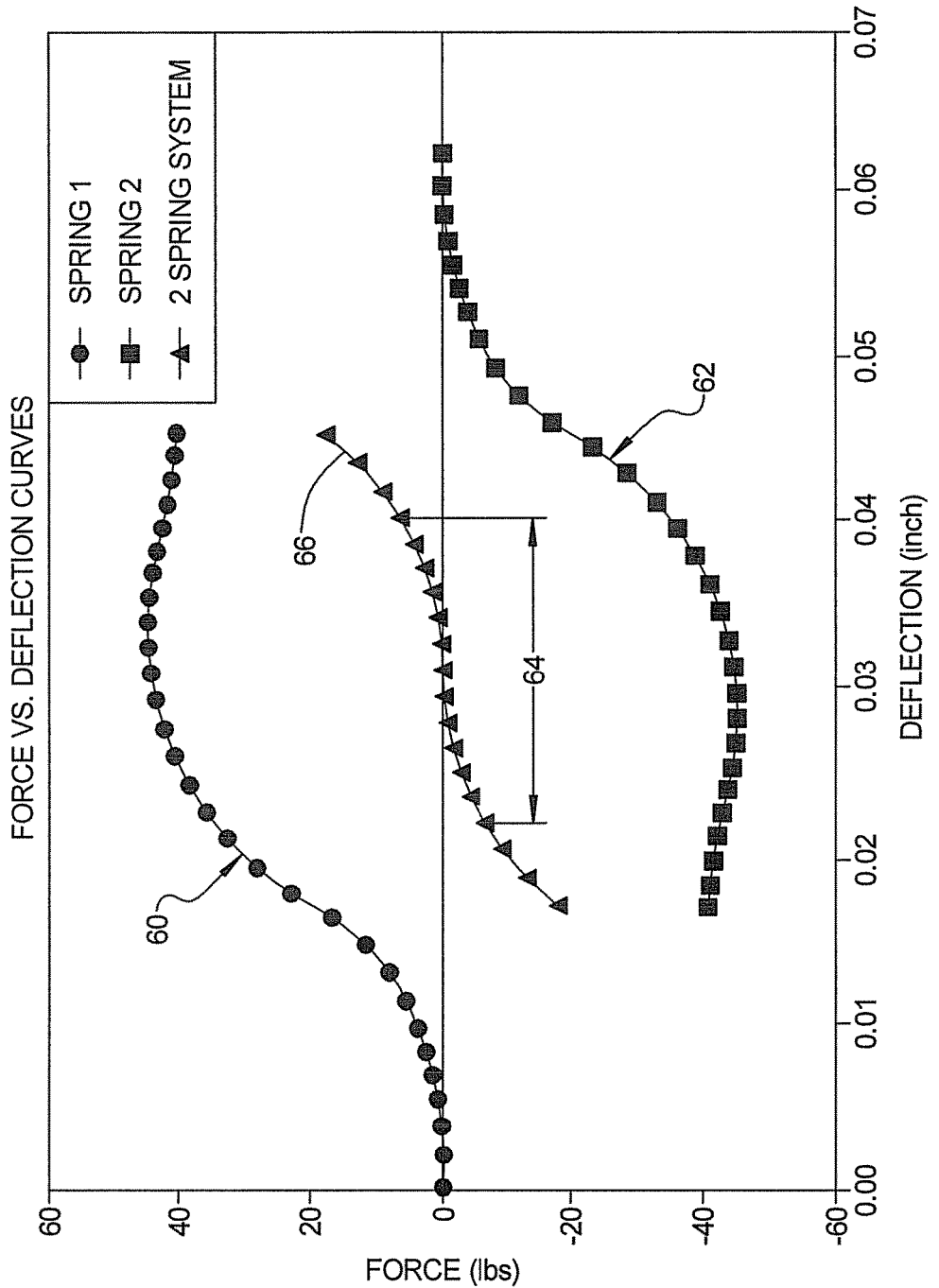
FIG. 6 is a graph illustrating the force versus deflection curves of a pair of Bellville springs arranged in facing relationship with one another, such as shown with the apparatus of FIG. 1, and illustrating the region of low stiffness within which the springs operate.

Referring briefly to FIG. 6, the force versus deflection curves for exemplary spring discs 22 and 24 are indicated by curves 60 and 62, respectively. The reaction forces from disc springs 22,24 are in opposite directions because of the opposing configuration of the springs. The resulting region of low stiffness of the disc spring pair 22,24 is defined by portion 64 of curve 66. Again, ideally, the preload force supplied to the disc spring pair 22,24 is such as to deflect the disc springs 22,24 to a midpoint of the low stiffness range 64.

In operation, as the apparatus 10 of FIG. 1 experiences vibration from the vibrating structure, the deflection of each of the disc springs 22 and 24 within the region defined by arrow 64 in FIG. 6 causes strains to be generated within the disc springs. Analysis indicates that for this exemplary configuration, approximately 1000 microstrain is achieved for a 0.020 inch (0.508 mm) deflection of each disc spring 22 and 24. These strains are transmitted to their respective piezoelectric material rings 32 and 34 through the epoxy 50,54 (FIG. 2A) and converted into electrical energy by the piezoelectric material rings as the rings are strained.

With the apparatus 10, the opposed arrangement of the disc springs 22 and 24 allows each of the disc springs to be preloaded to its low stiffness region and the deflecting motion of the disc springs is not in anyway impeded by the motion of the other. In certain geometries and/or applications, it may be preferable to provide the support ring 26 with a height that enables each of the disc springs 22 and 24 to flex beyond its flattened position.

An alternative implementation of the apparatus 10 involves securing the apparatus 10 to a vibrating structure by using a portion of the threaded fastening member 14. The fastening member 14 would need to have a length sufficient to allow for this. With this arrangement, the "input" vibration energy would be applied to the fastening member 14, which would then cause flexing of the disc springs 22 and 24. One advantage of this implementation would be that the mass of the support ring 26 (FIG. 1) could be used to enhance the amplitude of the vibrating motion of the apparatus 10, and thus even further increase the sensitivity of the apparatus 10 to low frequency vibration energy.

The disc springs 22 and 24 are able to respond to a wide frequency range of low amplitude vibration energy. The apparatus 10 is responsive to a vibration energy having a frequency as low as about 5 Hz or potentially even lower. This is due in part to the low stiffness of the disc springs 22,24 when they are preloaded. Some forms of vibration energy harvesting devices have relied on biasing a support member to a "buckling" point to soften the biasing member, and thus heighten its responsiveness to vibration energy. However, buckling is highly sensitive to boundary conditions that can sometimes be difficult to closely manage during a manufacturing process. The low stiffness of the disc springs 22 and 24 can be achieved in large part because of their natural force-deflection characteristics, arising from their axisymmetric geometry. This helps to make the disc springs 22 and 24 less sensitive to boundary conditions than devices that employ buckling to soften the support element.

Referring now to FIGS. 7 and 8, two alternative arrangements are shown for supporting the disc springs 22,24 to minimize the friction between the inner and outer edges of the disc springs with the components with which they are in contact. It will be appreciated that minimizing the friction enhances the ability of the disc springs 22,24 to respond to low frequency and/or lower amplitude vibration from a vibrating structure. In FIG. 7 a permanent magnet 70 is bonded or otherwise secured in an outer peripheral edge 72 of a disc spring 74, which may be identical or similar to disc springs 22 and 24. More preferably, a plurality of permanent magnets 70 will be secured about the peripheral edge 72 of the disc spring 74 and spaced apart from one another. An inner peripheral edge 76 may correspond to an edge of disc spring 22 immediately adjacent the aperture 36. A magnet 78 is attached to a supporting structure 80, which may or may not correspond to the support ring 26 shown in FIGS. 1 and 2, while another permanent magnet 82 is coupled to a structure 84 adjacent the inner peripheral edge 76. The permanent magnets 70 and 76 are further arranged such their negative poles face the negative poles of magnets 78 and 82, respectively. In this manner the magnetic forces from the magnets pairs 70/78 and 76/82 repel, thus preventing physical contact of the magnets of each pair 70/78 and 76/82 when the disc spring 74 is preloaded.

Another arrangement for forming a magnetic bearing is shown in FIG. 8. The disc spring 74 includes two permanent magnets 70A and 70B formed in its outer peripheral edge 72, while the inner peripheral edge 75 includes a permanent magnet 76'. A fastening structure 84 includes a permanent magnet 82' formed therein. Preferably, a plurality of pairs of magnets 70A,70B, and a plurality of magnets 76' will be spaced apart around the peripheral edges 72 and 75, respectively, of the disc spring 74. The magnets 70A,70B and magnets 76A,76B are arranged so that their magnetic lines of flux repel. Furthermore, magnets 76'/82' have their magnetic poles arranged so that they repel. Peripheral edges 72 and 75 will thus be supported in a non-contact arrangement.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A method of forming an energy harvesting device for harvesting vibrational energy from an external vibration structure, the method comprising:
   supporting, using a support element, an outer peripheral edge of a first disc spring, wherein the support element is configured to allow oscillations of the first disc spring relative to the support element, the oscillations responsive to vibrational energy received from the external vibration structure;
   applying a first preload force to the first disc spring directed along an axial center of the first disc spring;
   fixedly securing, during application of the first preload force, a first piezoelectric material with a surface of the first disc spring; and
   applying a second preload force to the first disc spring to thereby provide a predetermined reduction of a stiffness of the first disc spring, wherein the reduction of the stiffness corresponds to an increased sensitivity to low-frequency components of the vibrational energy received from the external vibration structure.

2. The method of claim 1, wherein the support element comprises a circumferential support ring.

3. The method of claim 1, wherein applying the first preload force is performed using a fastening assembly comprising a threaded fastener coupled with a threaded nut,
   wherein the threaded fastener extends through an opening formed at the axial center of the first disc spring, and
   wherein applying the second preload force comprises tightening the threaded fastener with the threaded nut using a predetermined number of turns.

4. The method of claim 3, further comprising:
   securing, using the fastening assembly, a second disc spring with the support element, the second disc spring arranged with an opposing relationship to the first disc spring,
   wherein tightening the threaded fastener with the threaded nut operates to apply the second preload force to the first disc spring contemporaneously with applying a third preload force to the second disc spring.

5. The method of claim 4, wherein each of the first disc spring and the second disc spring define an respective opening at an axial center thereof, and
   wherein the threaded fastener extends through the openings of the first disc spring and the second disc spring.

6. The method of claim 1, wherein fixedly securing the first piezoelectric material with the surface of the first disc spring comprises bonding the surface with at least a first portion of an undersurface of the first piezoelectric material using a first adhesive compound.

7. The method of claim 6, wherein the first adhesive compound comprises an electrically conductive adhesive compound.

8. The method of claim 7, wherein fixedly securing the first piezoelectric material to the surface of the first disc spring further comprises bonding the surface with at least a second portion of the undersurface using a second, electrically non-conductive adhesive compound.

9. The method of claim 1, further comprising:
   arranging a second disc spring with an opposing relationship to the first disc spring; and
   supporting the second disc spring using the support element.

10. The method of claim 9, further comprising:
    applying a third preload force to the second disc spring.

11. The method of claim 9, wherein the support element comprises a circumferential support ring contacting each of the first disc spring and the second disc spring only along a respective outer peripheral edge.

12. The method of claim 9, further comprising:
    fixedly securing a second piezoelectric material to a surface of the second disc spring,
    wherein applying the second preload force to the first disc spring comprises applying a third preload force to the second disc spring to thereby provide a predetermined reduction of a stiffness of the second disc spring.

13. The method of claim 9, wherein the first disc spring and the second disc spring share a common diameter, the method further comprising:
    arranging the first disc spring and the second disc spring such that axial centers of the first disc spring and the second disc spring are aligned along a common axis.

14. The method of claim 1, wherein the support element comprises a circumferential support ring coupled with a support assembly distributed among a plurality of discrete locations along the circumferential support ring, and wherein the support assembly supports the outer peripheral edge of the first disc spring by magnet pairs in a non-contact arrangement by repelling magnetic forces of the magnet pairs.

* * * * *